(12) United States Patent
Tomita et al.

(10) Patent No.: US 8,375,964 B2
(45) Date of Patent: Feb. 19, 2013

(54) TEMPLATE CLEANING METHOD, SYSTEM, AND APPARATUS

(75) Inventors: Hiroshi Tomita, Yokohama (JP); Hisashi Okuchi, Yokohama (JP); Minako Inukai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 548 days.

(21) Appl. No.: 12/560,210

(22) Filed: Sep. 15, 2009

(65) Prior Publication Data

US 2010/0132742 A1 Jun. 3, 2010

(30) Foreign Application Priority Data

Dec. 2, 2008 (JP) ................................. 2008-307215

(51) Int. Cl.
*B08B 3/02* (2006.01)
(52) U.S. Cl. .......................... 134/148; 134/153; 134/902
(58) Field of Classification Search .................. 134/113, 134/148, 153, 901, 902
See application file for complete search history.

(56) References Cited

U.S. PATENT DOCUMENTS

| | | | |
|---|---|---|---|
| 7,195,734 B2 | 3/2007 | Heidari | |
| 7,300,524 B2 * | 11/2007 | Asano | ............................. 134/18 |
| 7,959,739 B2 * | 6/2011 | Beck | ................................. 134/2 |
| 2003/0159608 A1 | 8/2003 | Heidari | |
| 2010/0085555 A1 * | 4/2010 | Schmid et al. | .................. 355/76 |

FOREIGN PATENT DOCUMENTS

| | | |
|---|---|---|
| JP | 2003-516644 | 5/2003 |
| JP | 2003-289058 | * 10/2003 |
| JP | 2004-241731 | * 8/2004 |
| JP | 2004-334727 | 11/2004 |
| JP | 2004-335727 | 11/2004 |
| JP | 2006-120681 | 5/2006 |
| JP | 2008-270686 | 11/2008 |

OTHER PUBLICATIONS

Notification of Reason for Rejection issued by the Japanese Patent Office on Aug. 28, 2012, for Japanese Patent Application No. 2008-307215, and English-language translation thereof.

* cited by examiner

*Primary Examiner* — Frankie L Stinson
(74) *Attorney, Agent, or Firm* — Finnegan, Henderson, Farabow, Garrett & Dunner, L.L.P.

(57) ABSTRACT

A template cleaning method for cleaning a template for nanoimprint, according to an embodiment of the present invention includes placing a wafer on a stage provided in a chamber, cleaning the wafer placed on the stage, inspecting the wafer for particles after the cleaning of the wafer, placing the template on the stage after the inspection of the wafer, and cleaning the template placed on the stage.

20 Claims, 15 Drawing Sheets

(A)     (B)

TEMPLATE CLEANING METHOD, SYSTEM, AND APPARATUS

CROSS REFERENCE TO RELATED APPLICATION

This application is based upon and claims the benefit of priority from the prior Japanese Patent Application No. 2008-307215, filed on Dec. 2, 2008, the entire contents of which are incorporated herein by reference.

BACKGROUND OF THE INVENTION

1. Field of the Invention

The present invention relates to a template cleaning method, a template cleaning system, and a template cleaning apparatus which are used for, for example, cleaning a template for nanoimprint.

2. Background Art

In recent years, a miniaturization of a semiconductor device has been advanced, and there is a need to produce a device that has an extremely miniaturized structure of 30 nm or less in size. In such a case, where a nanoimprint technique is used, a cleaning process needs to be carried out to eliminate particles of the same size as the resist filling width of a template.

At present, the minimum size of defects that can be detected from a quartz template by a defect inspection apparatus is approximately 50 nm. On the other hand, where a device having an extremely miniaturized structure of 50 nm or less, such as a structure of 10 nm to 40 nm in size, is to be manufactured by a nanoimprint technique, it is necessary to clean the template to remove minute-size particles of approximately 10 nm to 40 nm in size. However, particles of such minute sizes cannot be detected by today's defect inspection apparatuses.

Therefore, when a template is cleaned, the cleaning needs to be performed by a template cleaning apparatus from which particles of such minute sizes have been eliminated. This is because particles of such minute sizes adhering as defects to a template cannot be detected by today's defect inspection apparatuses.

JP-A 2008-270686(KOKAI) discloses examples of a pattern forming apparatus and a pattern forming method using a nanoimprint technique.

SUMMARY OF THE INVENTION

An aspect of the present invention is, for example, a template cleaning method for cleaning a template for nanoimprint, the method including placing a wafer on a stage provided in a chamber, cleaning the wafer placed on the stage, inspecting the wafer for particles after the cleaning of the wafer, placing the template on the stage after the inspection of the wafer, and cleaning the template placed on the stage.

Another aspect of the present invention is, for example, a template cleaning system for cleaning a template for nanoimprint, the system including a chamber for containing a wafer and the template, a stage on which the wafer and the template are capable of being placed, the stage being provided in the chamber, a transfer arm which is capable of transferring the wafer and the template into the chamber, and a particle inspection apparatus for inspecting the wafer for particles.

Another aspect of the present invention is, for example, a template cleaning apparatus for cleaning a template for nanoimprint, the system including a chamber for containing a wafer and the template, a stage on which the wafer and the template are capable of being placed, the stage being provided in the chamber, and a transfer arm which is capable of transferring the wafer and the template into the chamber.

DESCRIPTION OF THE EMBODIMENTS

Embodiments of the present invention will be described with reference to the accompanying drawings.

First Embodiment

Figure 1:
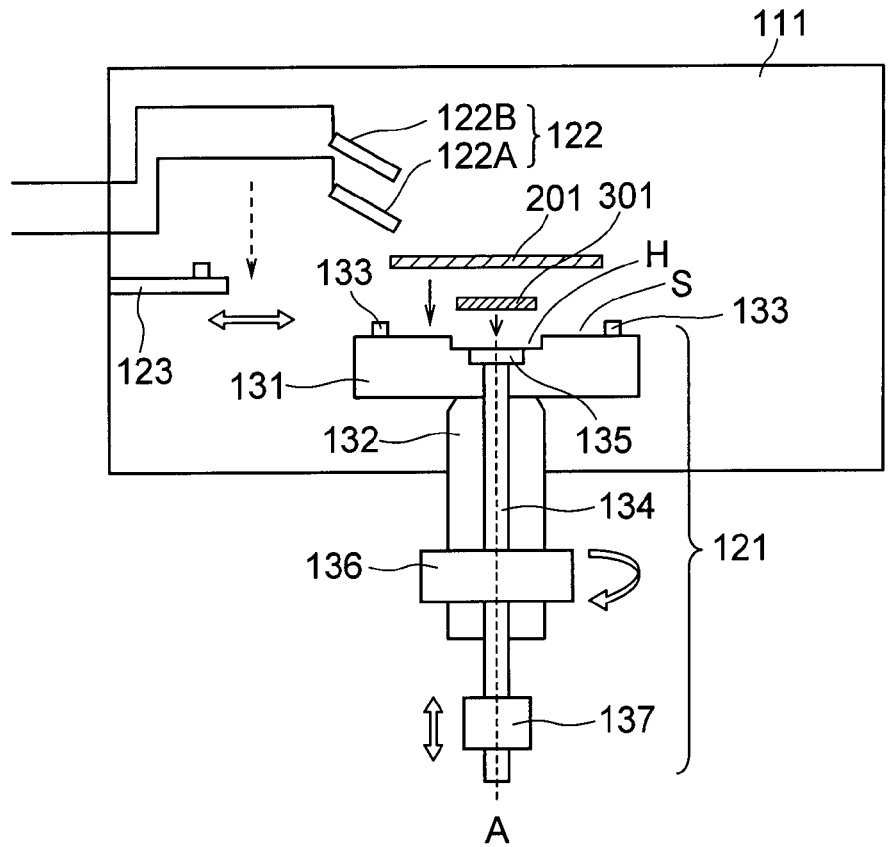
FIG. 1 is a side sectional view showing a structure of a template cleaning apparatus in accordance with a first embodiment.

FIG. 1 is a side sectional view showing a structure of a template cleaning apparatus 101 in accordance with a first embodiment.

The template cleaning apparatus 101 shown in FIG. 1 is an apparatus for cleaning a template for nanoimprint, but is also capable of cleaning a wafer. In FIG. 1, reference numeral 201 indicates the wafer, and reference numeral 301 indicates the template for nanoimprint. In this embodiment, the template 301 is cleaned after the wafer 201 is cleaned in order to clean the template 301 in a circumstance where minute-size particles are eliminated.

Figure 2:
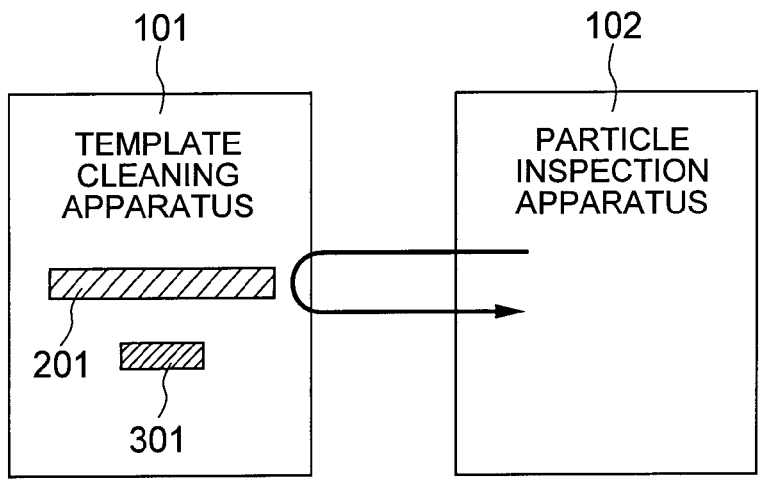
FIG. 2 is a block diagram showing a structure of a template cleaning system in accordance with the first embodiment.

FIG. 2 is a block diagram showing a structure of a template cleaning system 401 in accordance with the first embodiment. The template cleaning system 401 shown in FIG. 2 includes the template cleaning apparatus 101 of FIG. 1 and a particle inspection apparatus 102. The particle inspection apparatus 102 inspects the wafer 201 for particles. In this embodiment, the particle inspection apparatus 102 is used to inspect the wafer 201 for particles before and after the cleaning.

Now, a defect inspection apparatus that is capable of inspecting a template for defects, and a particle inspection apparatus that is capable of inspecting a 300 nm wafer for particles are described.

At present, the minimum size of defects that can be detected by a defect inspection apparatus for inspecting a template for defects is approximately 50 nm, while a particle inspection apparatus for inspecting a 300 nm wafer for particles is capable of detecting particles of approximately 30 nm in size. When a device having a miniaturized structure of 50 nm or smaller, such as a structure of approximately 10 nm to 40 nm in size, is manufactured by a nanoimprint technique, it is necessary to clean the template so as to remove minute-size particles of approximately 10 nm to 40 nm in size from the template. Such minute-size particles cannot be detected by a defect inspection apparatus for template, but can be detected by a particle inspection apparatus for 300 nm wafer.

Therefore, in this embodiment, before the template 301 is cleaned by the template cleaning apparatus 101, the wafer 201 is cleaned by the template cleaning apparatus 101. The particle inspection apparatus 102 then inspects the cleaned wafer 201 for particles. The particle inspection apparatus 102 checks whether a minute-size defects of 50 nm or smaller, for example, defects of approximately 30 nm in size, exist on the wafer 201. As described above, the particle inspection apparatus 102 is capable of detecting such minute-size defects. If the number of defects is equal to or smaller than a reference value, the inside of a chamber 111 (see FIG. 1) is determined to be clean, and the template cleaning apparatus 101 cleans the template 301.

Referring back to FIG. 1, description of the structure of the template cleaning apparatus 101 is resumed.

The template cleaning apparatus 101 shown in FIG. 1 includes the chamber 111, a spin chuck 121, plural nozzles 122, and a transfer arm 123.

The chamber 111 can accommodate the wafer 201 and the template 301. When the wafer 201 is cleaned, the wafer 201 is contained in the chamber 111. When the template 301 is cleaned, the template 301 is contained in the chamber 111.

The spin chuck 121 includes a stage 131, a spin shaft 132, plural chuck pins 133, a vertically movable shaft 134, a push-up board 135, a rotating motor 136, and a vertical drive motor 137. The vertically movable shaft 134, the push-up board 135, and the vertical drive motor 137 are examples of a movable shaft, a push-up member, and a motor of the invention, respectively.

The stage 131 is provided in the chamber 111. The wafer 201 and the template 301 can be placed on the stage 131. As shown in FIG. 1, the stage 131 has a flat stage surface S, and a hole H is formed at the center of the stage surface S. The wafer 201 is placed on the stage surface S, and the template 301 is placed in the hole H.

The spin shaft 132 is attached to the bottom surface of the stage 131. The rotating motor 136 is mounted on the spin shaft 132. When the rotating motor 136 rotates, the stage 131 and the spin shaft 132 rotate around a rotation axis A. Accordingly, the wafer 201 and the template 301 placed on the stage 131 also rotate around the rotation axis A. In this manner, the spin chuck 121 can cause the wafer 201 and the template 301 to rotate around the same rotation axis A.

Figure 3:
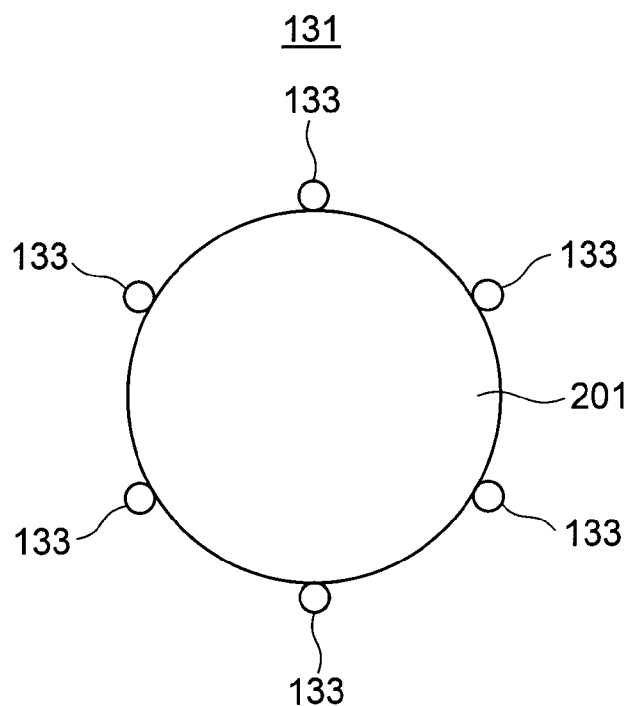
FIG. 3 is a top view showing a wafer placed on a stage.

The chuck pins 133 for holding the wafer 201 are formed on the (top) surface of the stage 131. Although the number of the chuck pins 133 is not fixed, six chuck pins are provided in this embodiment (see FIG. 3). FIG. 3 is a top view of the wafer 201 placed on the stage 131.

The vertically movable shaft 134 that vertically penetrates through the stage 131 and the spin shaft 132 is provided in the spin chuck 121. As shown in FIG. 1, the vertically movable shaft 134 is placed in such a position as to penetrate through the hole H. The push-up board 135 for moving the wafer 201 and the template 301 in the vertical direction is attached to the top end of the vertically movable shaft 134.

Figure 4:
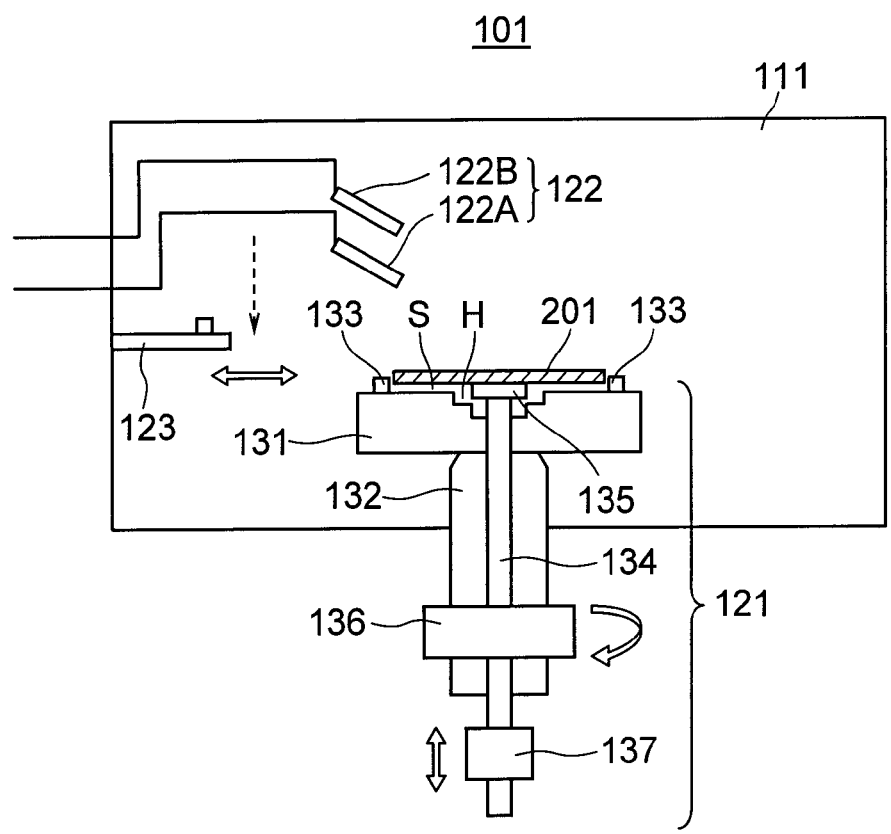
FIG. 4 is a side sectional view illustrating a situation where the wafer is placed on the stage.
Figure 5:
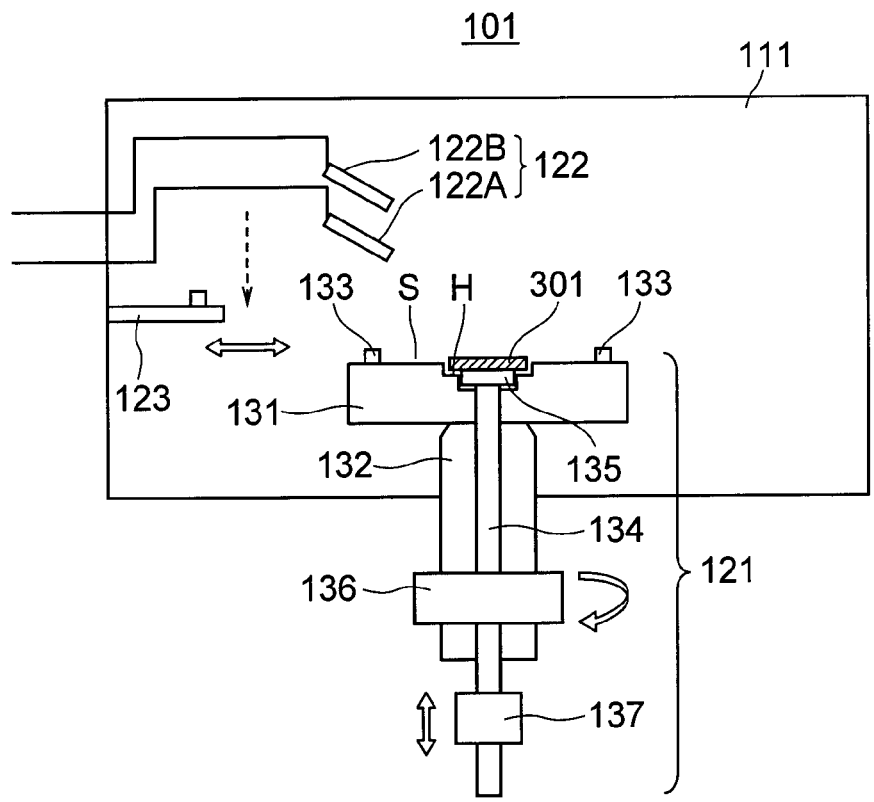
FIG. 5 is a side sectional view illustrating a situation where a template is placed on the stage.

The vertical drive motor 137 is also attached to the vertically movable shaft 134. When the vertical drive motor 137 is actuated, the vertically movable shaft 134 and the push-up board 135 start moving in the vertical direction. As a result, the wafer 201 and the template 301 supported by the push-up board 135 also move in the vertical direction. In this manner, the spin chuck 121 can set the wafer 201 and the template 301 onto the stage 131 (see FIGS. 4 and 5). FIGS. 4 and 5 illustrate situations where the wafer 201 and the template 301 are set onto the stage 131.

In FIG. 1, a first nozzle 122A and a second nozzle 122B are shown as the nozzles 122.

The first nozzle 122A is a nozzle for supplying chemical solutions onto the surfaces of the wafer 201 and the template 301 placed on the stage 131. The chemical solutions are used to clean the wafer 201 and the template 301. When the template cleaning apparatus 101 cleans the wafer 201 and the template 301, the spin chuck 121 rotate the wafer 201 and the template 301, and the chemical solutions are supplied onto the surfaces of the wafer 201 and the template 301 through the first nozzle 122A. In this manner, the wafer 201 and the template 301 are cleaned. The wafer 201 and the template 301 rotate around the center of rotation located on the rotation axis A, and the chemical solutions are supplied to a point near the center of rotation.

The second nozzle 122B is a nozzle for supplying pure water onto the surfaces of the wafer 201 and the template 301 placed on the stage 131. The pure water is used to remove the chemical solutions from the wafer 201 and the template 301. When the template cleaning apparatus 101 removes the chemical solutions from the wafer 201 and the template 301, the spin chuck 121 rotates the wafer 201 and the template 301, and the pure water is supplied onto the surfaces of the wafer 201 and the template 301 through the second nozzle 122B. In this manner, the chemical solutions are removed from the wafer 201 and the template 301. The wafer 201 and the template 301 rotate around the center of rotation located on the rotation axis A, and the pure water is supplied to a position near the center of rotation.

In this embodiment, the same chemical solution is used for the cleaning of the wafer 201 and the cleaning of the template 301. This chemical solution is supplied through the first nozzle 122A, whether the wafer 201 or the template 301 is cleaned. An example of this chemical solution is a mixture of sulfuric acid and hydrogen peroxide solution (SPM).

Figure 6:
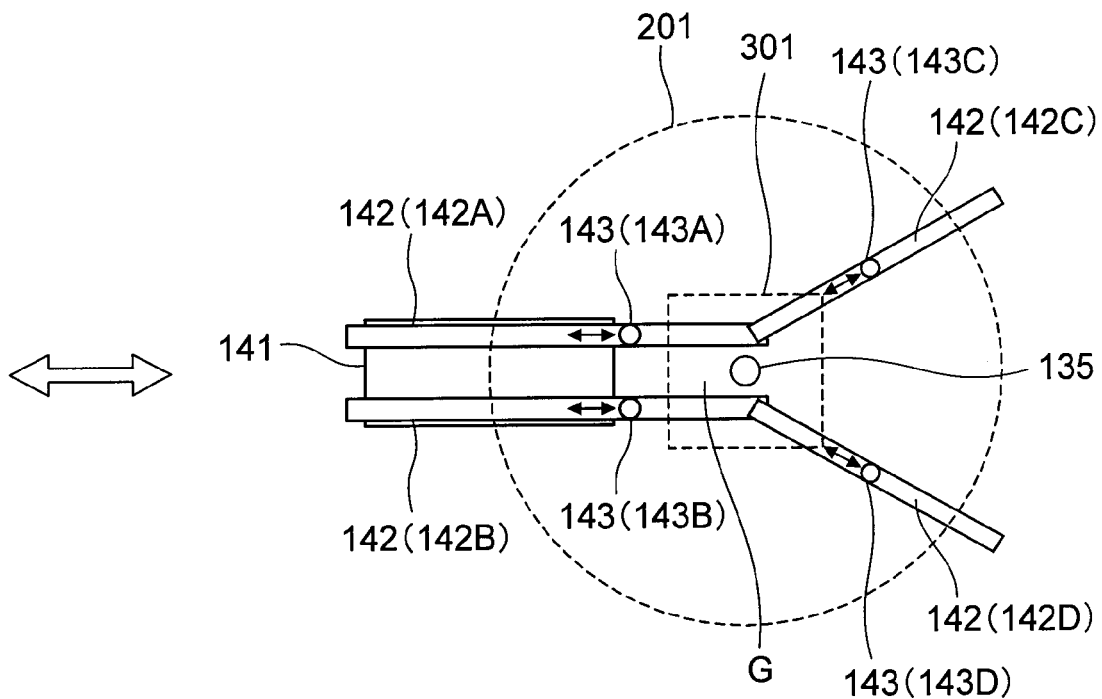
FIG. 6 is a top view showing a structure of a transfer arm in accordance with the first embodiment.

The transfer arm 123 is capable of transferring the wafer 201 and the template 301 into the chamber 111. Referring to FIG. 6, the structure of the transfer arm 123 is described.

FIG. 6 is a top view showing a structure of the transfer arm 123. As shown in FIG. 6, the transfer arm 123 includes an arm body 141, plural supporting members 142, and plural chuck pins 143.

The supporting members 142 are attached directly or indirectly to the arm body 141. The supporting members 142 are used to support the wafer 201 and the template 301 to be transferred.

In FIG. 6, a first supporting member 142A, a second supporting member 142B, a third supporting member 142C, and a fourth supporting member 142D are shown as the supporting members 142. The first and second supporting members 142A and 142B are attached to the arm body 141 in a parallel fashion. The third and fourth supporting members 142C and 142D are attached to the top ends of the first and second supporting members 142A and 142B, respectively. The third and fourth supporting members 142C and 142D are arranged so as to form a V-like shape.

The chuck pins 143 are provided on the upper faces of the supporting members 142. The chuck pins 143 are used to hold the wafer 201 and the template 301 to be supported by the supporting members 142.

In FIG. 6, a first chuck pin 143A, a second chuck pin 143B, a third chuck pin 143C, and a fourth chuck pin 143D are shown as the chuck pins 143. The first to fourth chuck pins 143A to 143D are provided on the first to fourth supporting members 142A to 142D, respectively.

In FIG. 6, G represents a gap between the first supporting member 142A and the second supporting member 142B. In this embodiment, the width of the gap G is set greater than the width (the diameter) of the upper face of the push-up board 135. Accordingly, in the template cleaning apparatus 101, the push-up board 135 is inserted in the gap G, and the wafer 201 and the template 301 can be transferred from the transfer arm 123 to the push-up board 135.

The operations for fetching the wafer 201 and the template 301 are now described.

FIGS. 7 to 10 illustrate a flow of the operation for fetching the wafer 201. FIGS. 7(A), 8(A), 9(A), and 10(A) are top views of the transfer arm 123. FIGS. 7(B), 8(B), 9(B), and 10(B) are side sectional views of the template cleaning apparatus 101.

Figure 7:
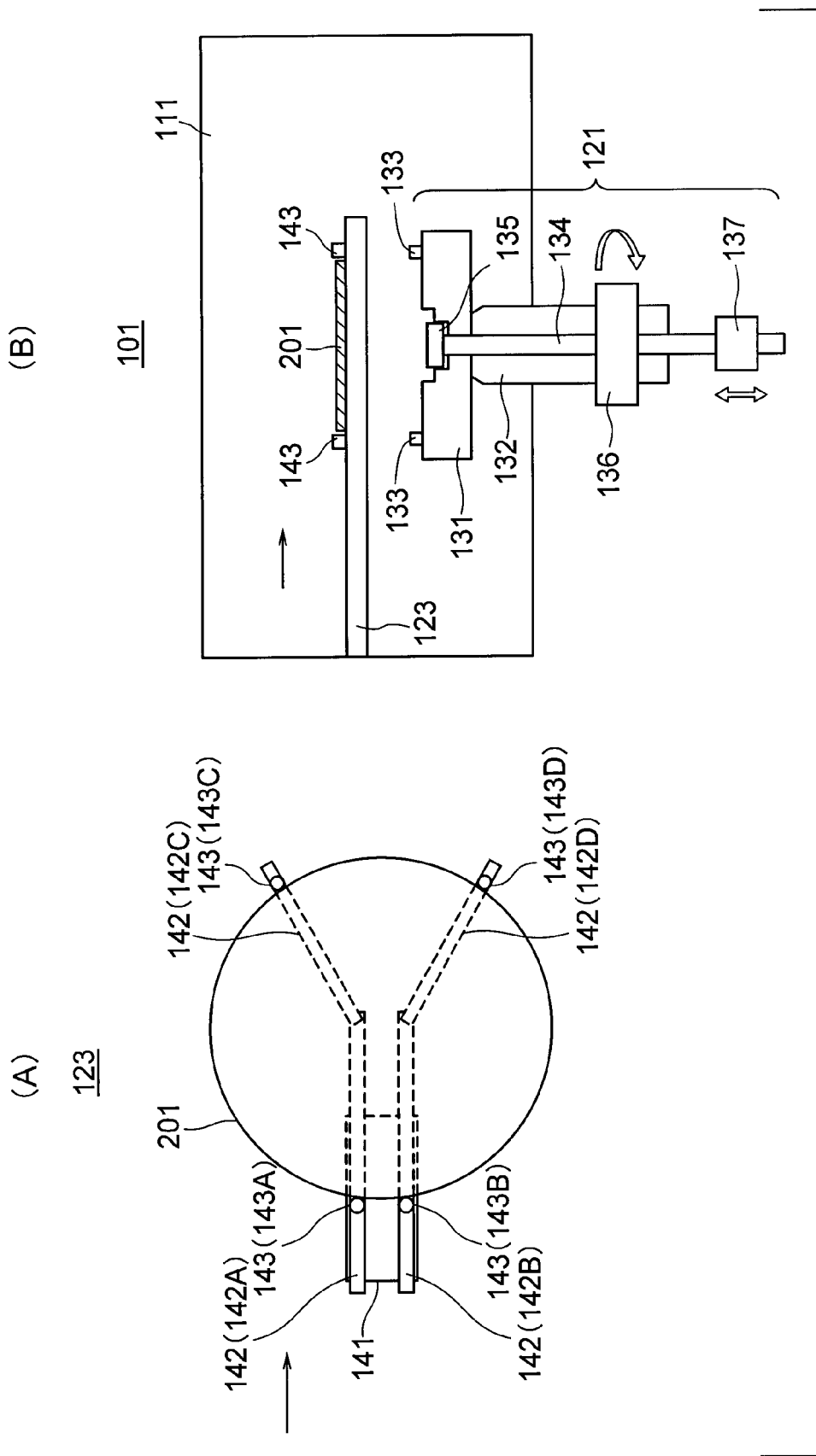
FIGS. 7 to 10 illustrate a flow of an operation for fetching the wafer.

First, as shown in FIG. 7, the transfer arm 123 transfers the wafer 201 to a position above the stage 131. In FIG. 7, the wafer 201 is supported by the supporting members 142, and is interposed between the chuck pins 143.

Figure 8:
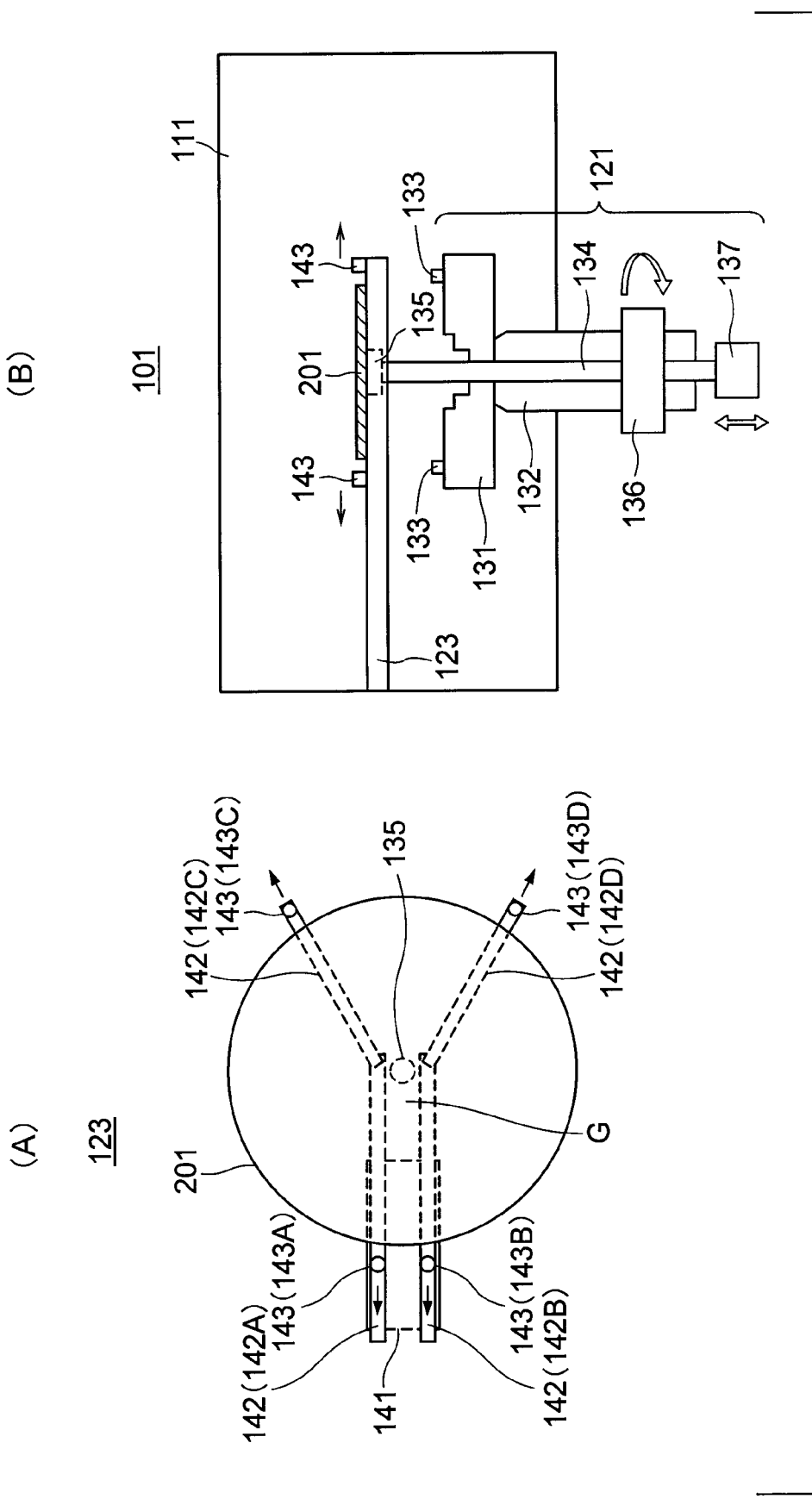

Next, as shown in FIG. 8, the vertically movable shaft 134 and the push-up board 135 move up, and the push-up board 135 enters the gap G. The chuck pins 143 are loosened, and the wafer 201 is released from the hold by the chuck pins 143.

Figure 9:
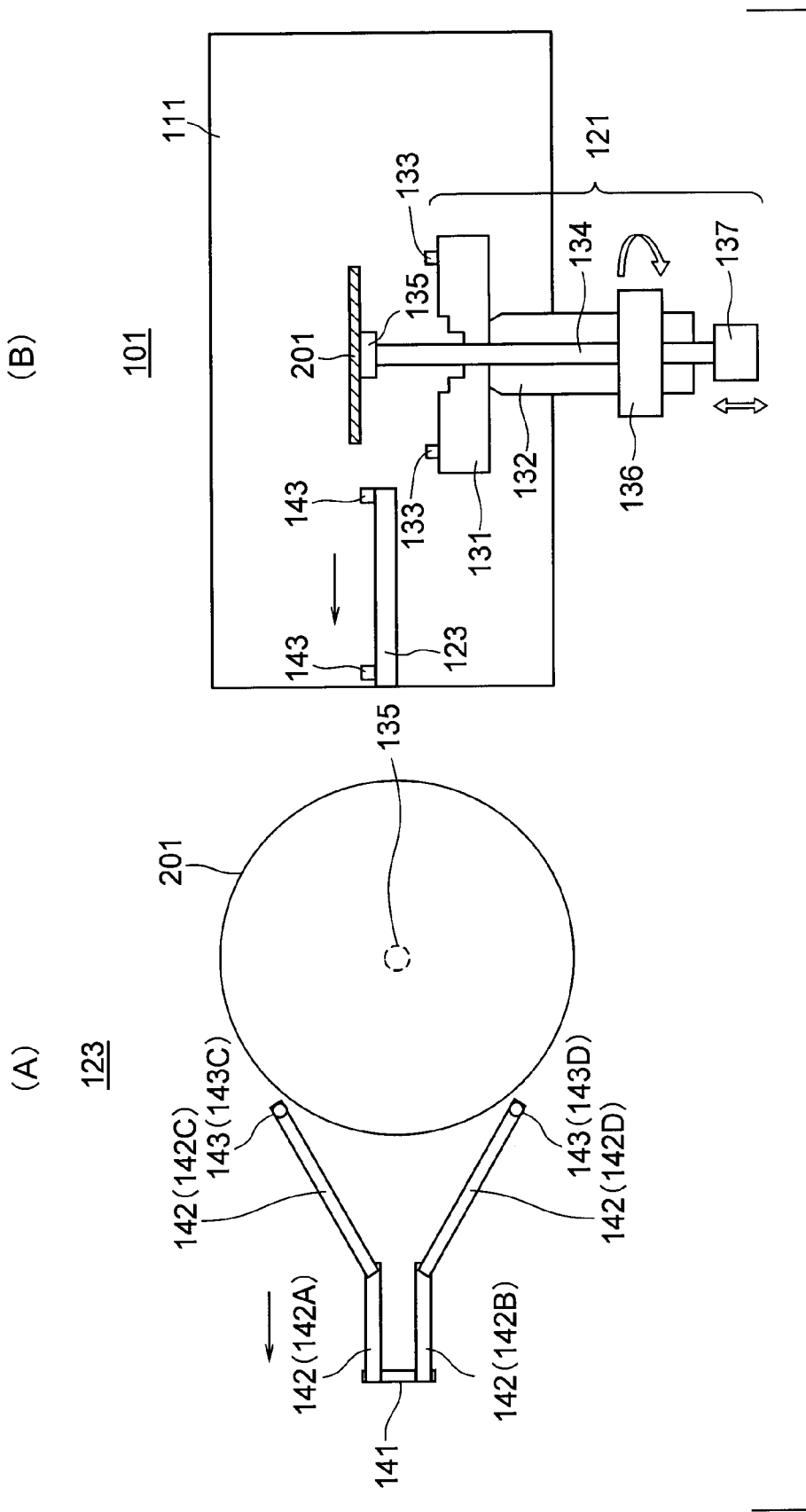

Next, as shown in FIG. 9, the transfer arm 123 leaves the wafer 201 above the stage 131, and retreats from the stage 131.

Figure 10:
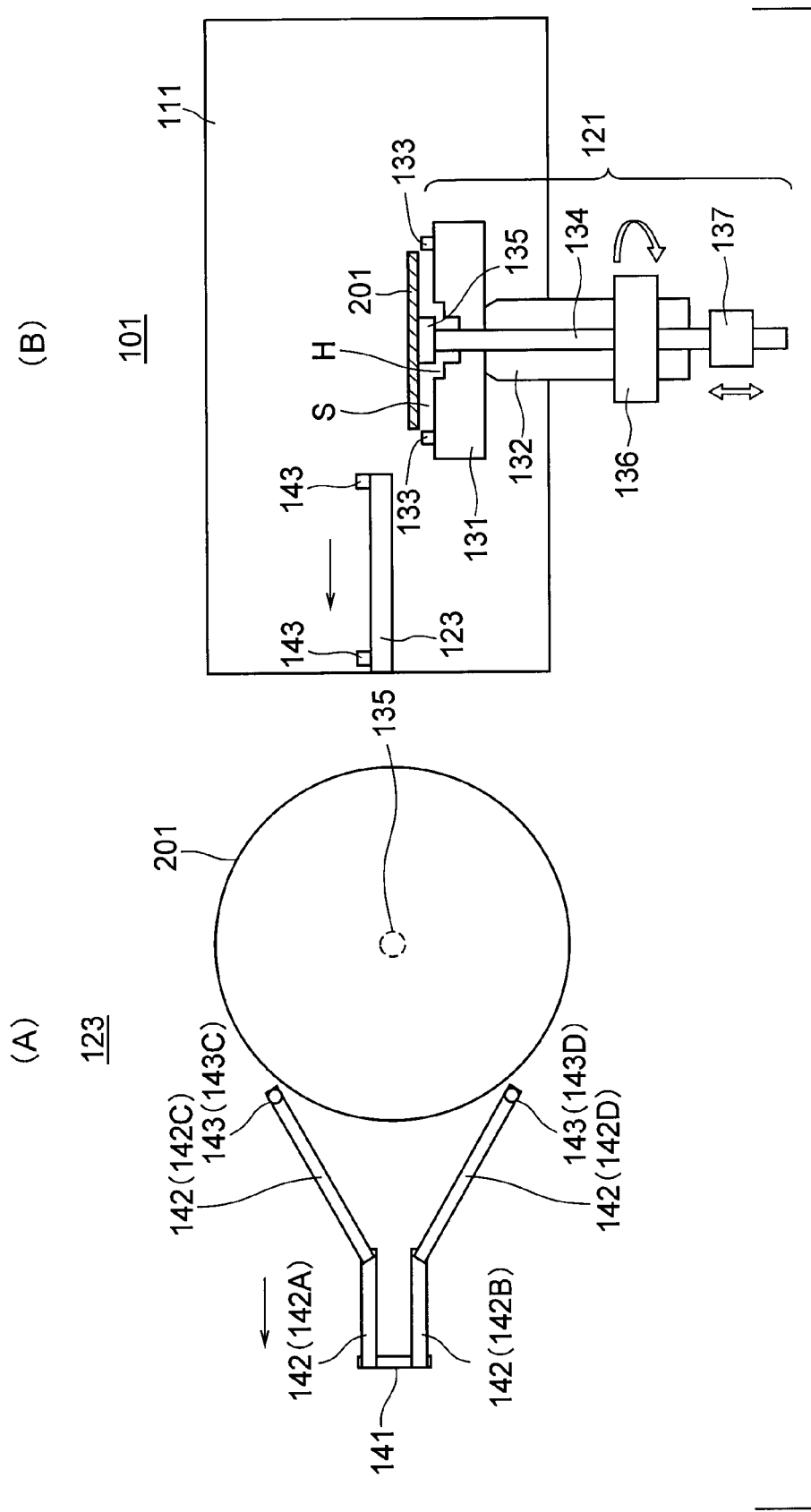
Figure 11:
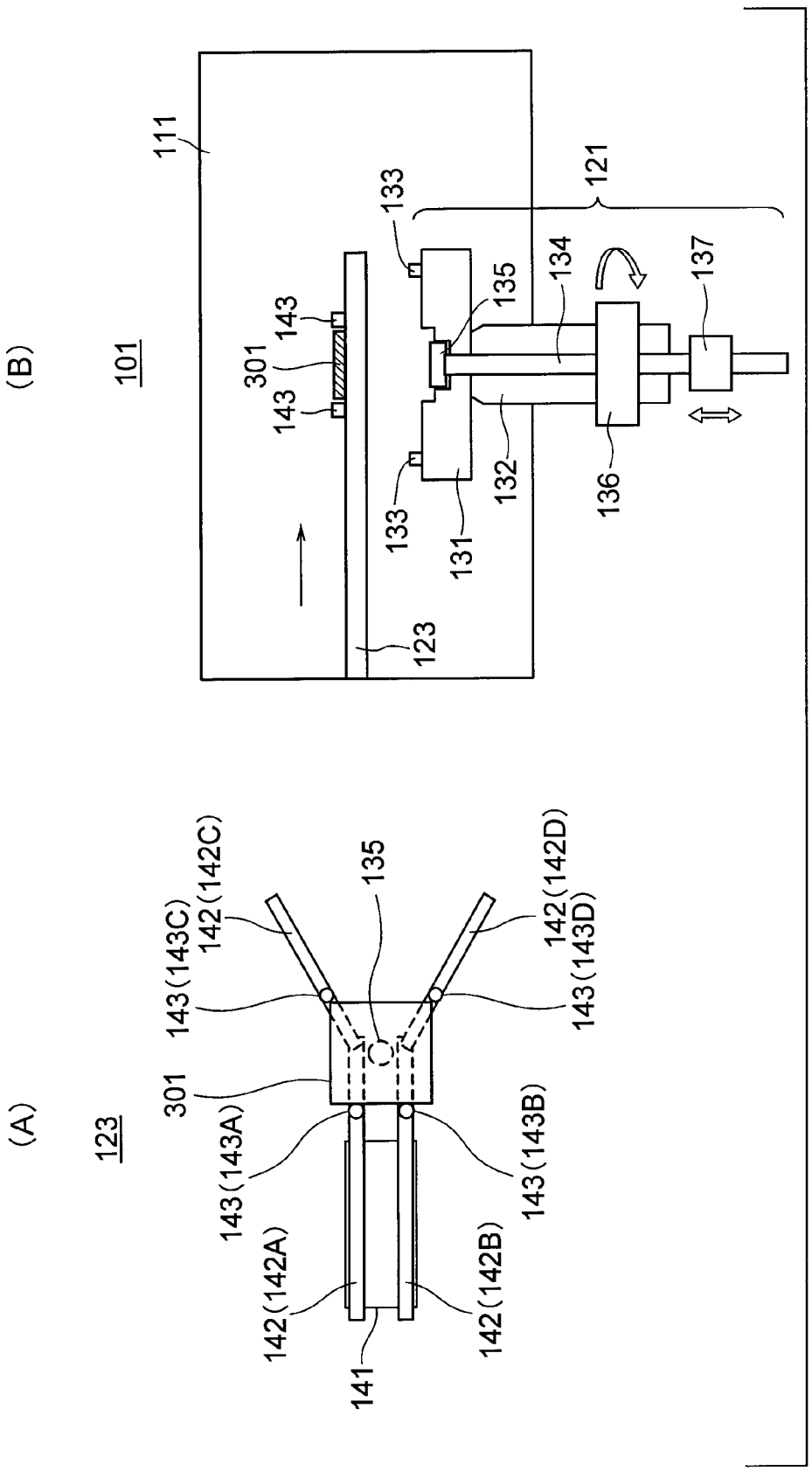
FIGS. 11 to 14 illustrate a flow of an operation for fetching the template.
Figure 12:
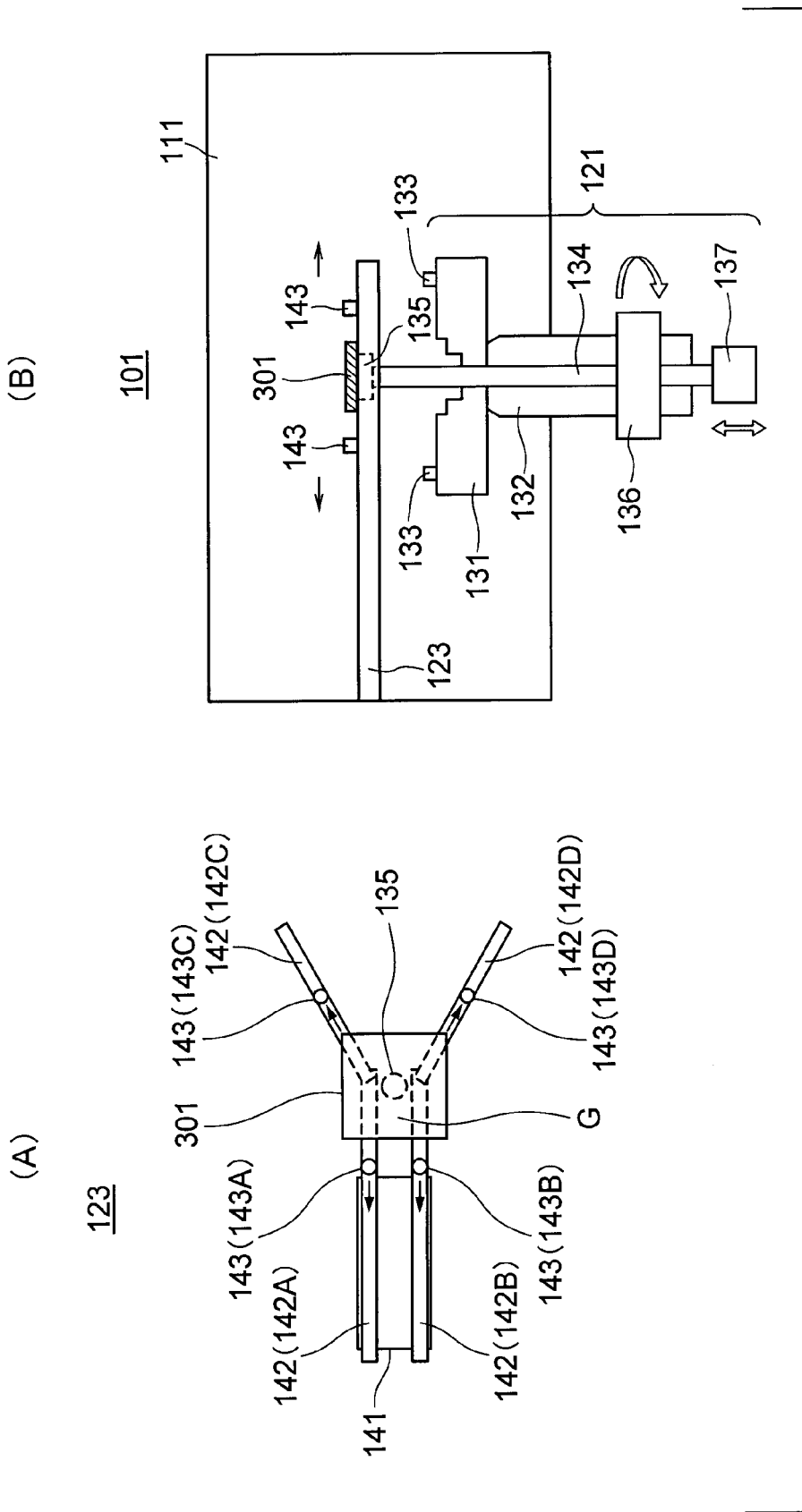
Figure 13:
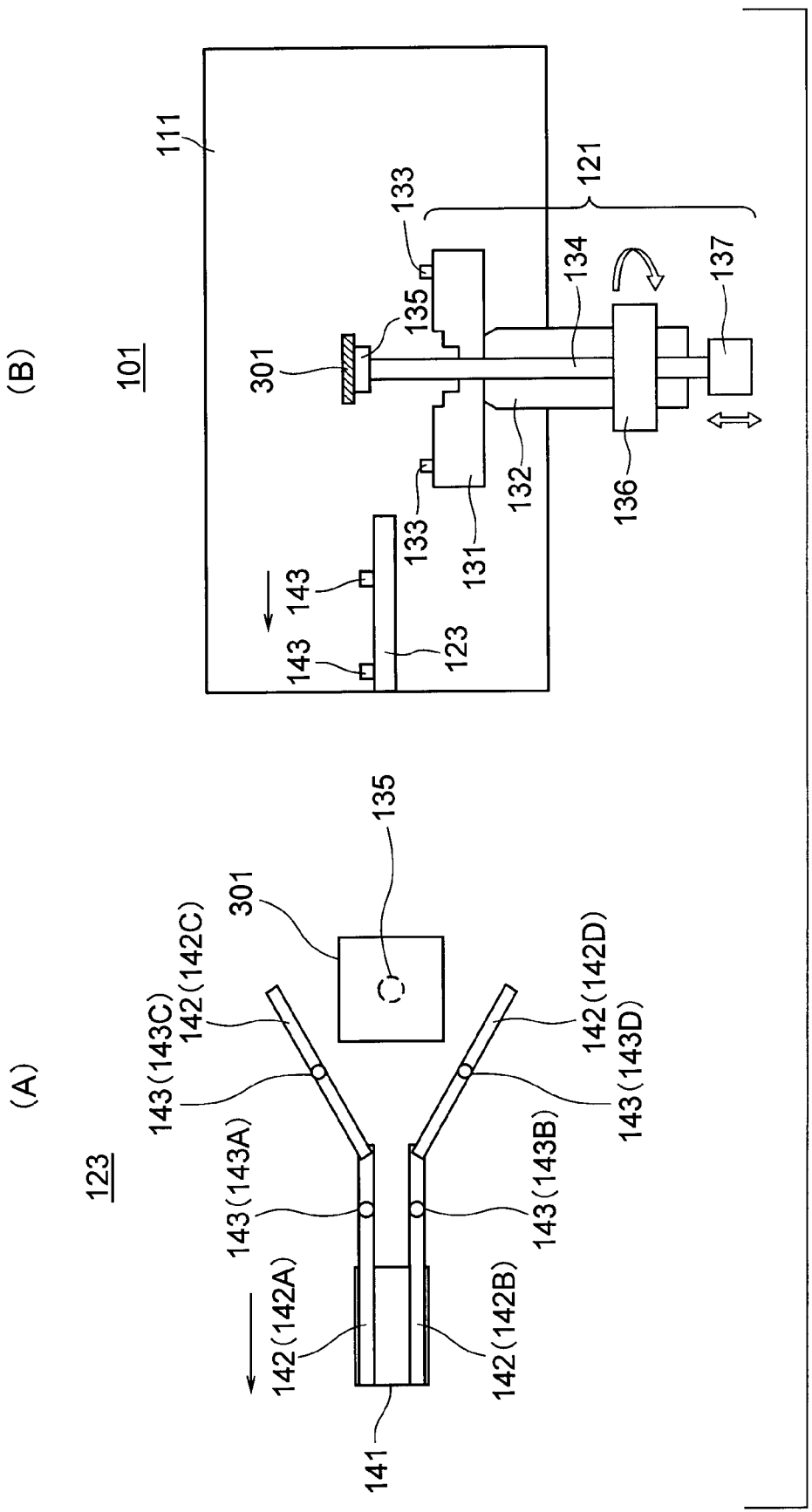
Figure 14:
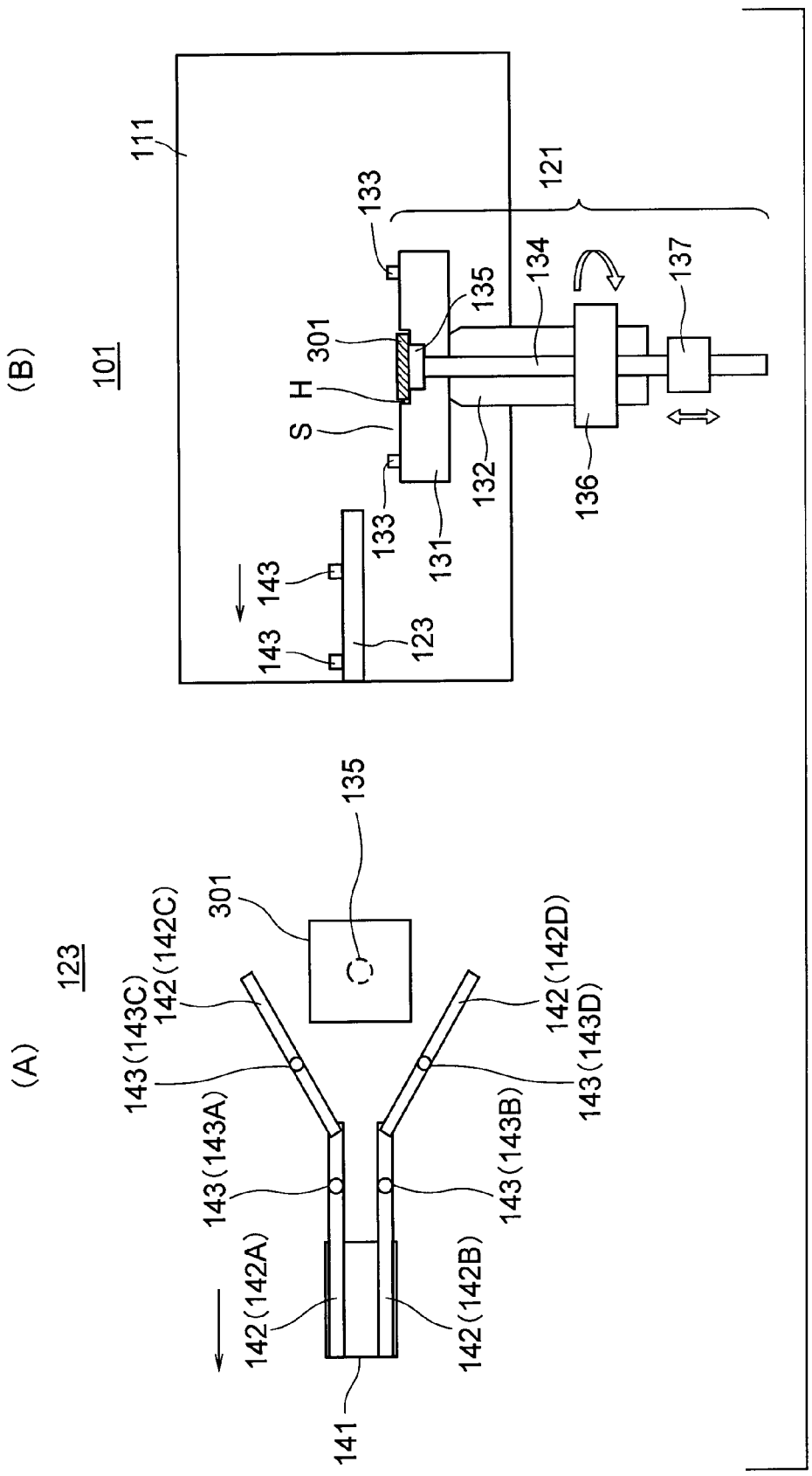

Next, as shown in FIG. 10, the vertically movable shaft 134 and the push-up board 135 move down together with the wafer 201, and the wafer 201 reaches the stage surface S. In this manner, the wafer 201 is placed on the stage 131.

FIGS. 11 to 14 illustrate a flow of the operation for fetching the template 301. FIGS. 11(A), 12(A), 13(A), and 14(A) are top views of the transfer arm 123. FIGS. 11(B), 12(B), 13(B), and 14(B) are side sectional views of the template cleaning apparatus 101.

The operation flow illustrated in FIGS. 11 to 14 is the same as the operation flow illustrated in FIGS. 7 to 10. Through the procedures of FIGS. 11 to 14, the template 301 reaches the inside of the hole H. In this manner, the template 301 is placed on the stage 131.

Referring back to FIG. 1, the wafer 201 and the template 301 are described.

The wafer 201 is, for example, a silicon wafer of 300 mm in diameter. However, the wafer 201 may have some other size and may be made of some other material. For example, the wafer 201 may be a silicon wafer having a silicon oxide film formed on its principal surface. In this embodiment, a wafer not having a pattern formed thereon is used as the wafer 201.

Figure 15:
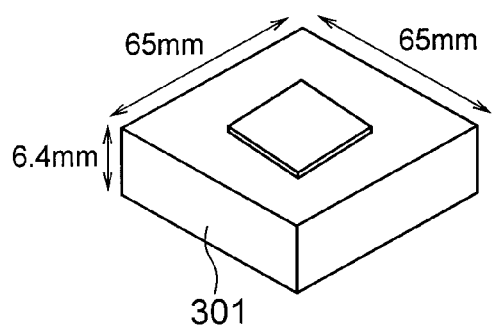
FIG. 15 illustrates a shape of the template.
Figure 15:
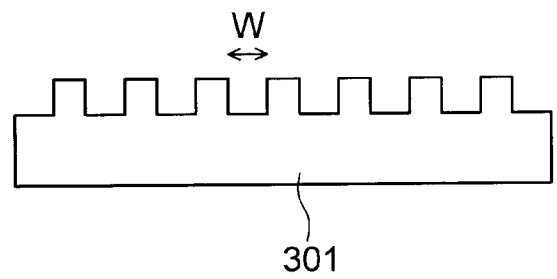

The template 301 is a template for nanoimprint, as described above. The template 301 is made of glass (silicon oxide), for example. Referring now to FIG. 15, a shape of the template 301 is described.

FIG. 15 illustrates the shape of the template 301. FIG. 15(A) is a perspective view showing the shape of the template 301. FIG. 15(B) is an enlarged side sectional view showing the shape of the template 301.

As shown in FIG. 15(A), the template 301 of this embodiment has a square template face. The size of the template face of the template 301 is 65 mm×65 mm, and the thickness of the template is 6.4 mm. The template 301 is produced by dicing a photomask of 150 mm×150 mm in size into four pieces. The size of the template face of the template 301 may be other than 65 mm×65 mm, and the thickness of the template may be other than 6.4 mm. For example, the size of the template face of the template 301 may be same as that of the photomask (i.e., 150 mm×150 mm).

As shown in FIG. 15(B), a pattern for nanoimprint is formed on the template 301 in this embodiment. In FIG. 15(B), an example of the pattern is shown. In this embodiment, a pattern having a resist filling width of 50 nm or smaller is formed on the template 301. In FIG. 15(B), W represents an example of the resist filling width.

As described above, in this embodiment, the chamber 111 in the template cleaning apparatus 101 is configured to be able to clean the wafer 201 and the template 301. Thereby, in this embodiment, whether the cleaning system is clean or not can be checked by cleaning the wafer 201 by the template cleaning apparatus 101, and inspecting the wafer 201 for particles by the particle inspection apparatus 102. In other words, a check can be made to determine whether the probability that minute-size particles adheres to the template 301 during the cleaning is high or not. Through such a process, in this embodiment, the template 301 can be cleaned, without any attention being paid to back contamination due to minute-size particles of 50 nm or smaller. The chamber 111 of this embodiment is a sheet-type cleaning chamber.

In this embodiment, the stage 131 is designed so that the wafer 201 and the template 301 can be placed thereon. Also, in this embodiment, the transfer arm 123 is designed to transfer the wafer 201 and the template 301. With this arrangement, the wafer 201 and the template 301 can be placed and transferred in the same chamber 111.

In this embodiment, the spin chuck 121 can rotate the wafer 201 and the template 301 around the same rotation axis A. Further, in this embodiment, the nozzles 122 can supply the same chemical solution onto the surfaces of the wafer 201 and the template 301. Accordingly, in this embodiment, the wafer 201 and the template 301 can be cleaned physically and chemically under the same cleaning conditions.

In this embodiment, the result of the inspection performed on the wafer 201 is used as the criterion for determining whether the template 301 is properly cleaned. Therefore, it is desirable that the conditions for cleaning the wafer 201 are the same as the conditions for cleaning the template 301. In view of this, it is desirable that the same rotation axis and the same chemical solution are used in this embodiment. Furthermore, since the stage 131 and the nozzles 122 are shared between the wafer 201 and the template 301, the angle and speed of the supply of the chemical solution can also be the same for the wafer 201 and the template 301.

In this embodiment, the template 301 is placed in the hole H formed in the stage 131. In this embodiment, the plane shape of the hole H is substantially the same as the plane shape of the template 301, and the depth of the hole H is set at substantially the same value as the thickness of the template 301. Accordingly, when the template 301 is placed inside the hole H, the hole H is almost completely filled, and the upper face of the stage 131 becomes almost flat. With this arrangement, the upper face of the stage 131 becomes as flat as the upper face of the wafer 201, and the commonality between the conditions for cleaning the wafer 201 and the conditions for cleaning the template 301 can be made even higher.

If the template 301 is made of glass (silicon oxide), it is desirable that the wafer 201 is a wafer having a silicon oxide film formed on its principal surface in this embodiment. With this arrangement, the material of the surface of the wafer 201 becomes the same as the material of the template 301, and the surface of the wafer 201 and the template 301 have the same wettability. Accordingly, the commonality in the cleaning conditions becomes even higher. As described above, it is desirable that a layer of the same material as the material of the template 301 is formed on the principal surface of the wafer 201.

The template cleaning in accordance with this embodiment is particularly effective for the template 301 having a pattern of 50 nm or smaller in resist filling width. This is because minute-size particles that cannot be detected by a defect inspection apparatus can be detected in accordance with this embodiment. The template cleaning apparatus 101 and the template cleaning system 401 of this embodiment may also be used to clean a template 301 that does not have a pattern of 50 nm or smaller in resist filling width.

In this embodiment, the wafer 201 is rotated through the rotation of the stage 131 and the spin shaft 132. Alternatively, the wafer 201 may be rotated through rotation of the vertically movable shaft 134 and the push-up board 135. In such a case, however, a rotating motor for rotating the vertically movable shaft 134 and the push-up board 135 needs to be provided in the spin chuck 121.

Likewise, the template 301 may be rotated through rotation of the vertically movable shaft 134 and the push-up board 135 in this embodiment. In such a case, the plane shape of the hole H needs to be such a shape as to allow the template 301 to rotate. Alternatively, the hole H does not need to be formed in the stage 131. This also applies to a case where the template 301 is rotated through the stage 131 and the spin shaft 132.

Figure 16:
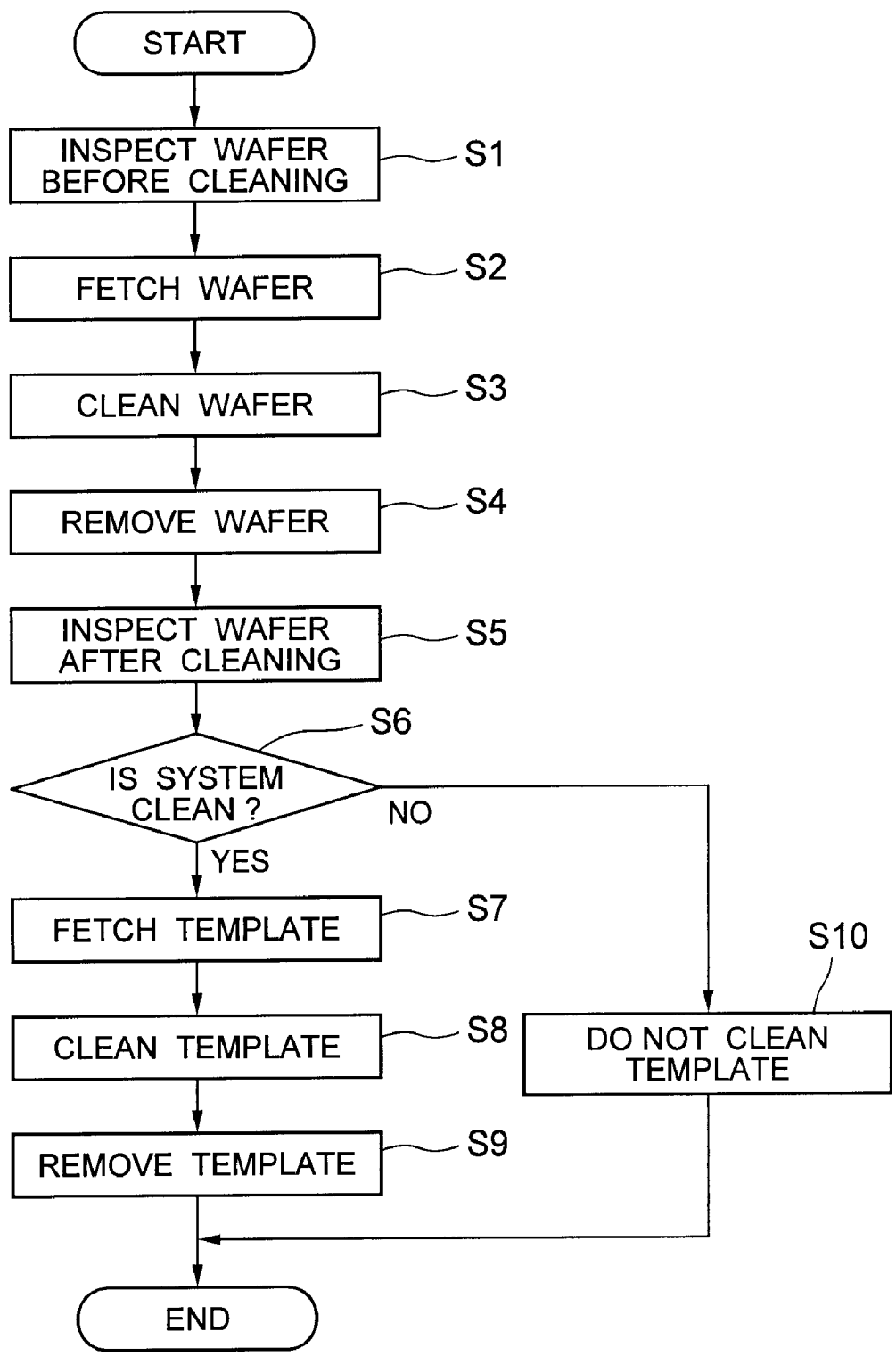
FIG. 16 is a flowchart showing a template cleaning method in accordance with the first embodiment.

FIG. 16 is a flowchart showing a template cleaning method in accordance with the first embodiment. The reference numerals used in the following description are also used in FIGS. 1 and 2.

First, before the template cleaning apparatus 101 cleans the wafer 201, the particle inspection apparatus 102 inspects the wafer 201 for particles (step S1). Thereby, the number of defects per unit area on the wafer 201 is measured.

Next, the wafer 201 is transferred into the chamber 111 by the transfer arm 123, and is placed on the stage 131 (step S2). Next, the wafer 201 placed on the stage 131 is cleaned with a chemical solution (step S3). Next, the chemical solution remaining on the wafer 201 is removed with pure water. Next, the wafer 201 is moved out of the chamber 111 by the transfer arm 123 (step S4). In this manner, the cleaning of the wafer 201 is completed.

Next, after the template cleaning apparatus 101 cleans the wafer 201, the particle inspection apparatus 102 inspects the wafer 201 for particles (step S5). Thereby, the number of defects per unit area on the wafer 201 is measured.

Next, based on the result of the inspection at step S1 and/or the result of the inspection at step S5, a check is made to determine whether the system to perform cleaning is clean (step S6). At step S6, cleanness may be assessed based on whether the number of defects detected at step S5 is equal to or smaller than a predetermined value. Alternatively, cleanness may be assessed based on whether the value obtained by dividing the number of defects detected at step S5 by the number of defects detected at step S1 is equal to or smaller than a predetermined value. In the latter case, the inspection at step S1 may not be carried out.

If the system is determined to be clean, the template 301 is cleaned (steps S7 to S9). If the system is determined not to be clean, the template 301 is not cleaned (step S10).

In the cleaning of the template 301, the template 301 is first transferred into the chamber 111 by the transfer arm 123, and is placed on the stage 131 (step S7). Then, the template 301 placed on the stage 131 is cleaned with the chemical solution (step S8). Then, the chemical solution remaining on the template 301 is removed with pure water. Then, the template 301 is moved out of the chamber 111 by the transfer arm 123 (step S9). In this manner, the cleaning of the template 301 is completed.

In this cleaning method, if the system is determined not to be clean, the particle inspection at step S5 may be again carried out. In such a case, the determining procedure at step 6 is also again carried out. If the system is determined to be clean, template cleaning is performed. If the system is again determined not to be clean, template cleaning is not performed.

In this cleaning method, if the system is determined not to be clean, various measures may be taken. For example, a filter for capturing fine particles in a cleaning chemical solution for the template cleaning apparatus 101 may be changed.

In this cleaning method, the particle inspection at step S5 is performed by the particle inspection apparatus 102, but the determining procedure at step S6 is supposedly carried out by a human. However, the particle inspection apparatus 102 may be designed to automatically carry out the determining procedure at step S6.

Figure 17:
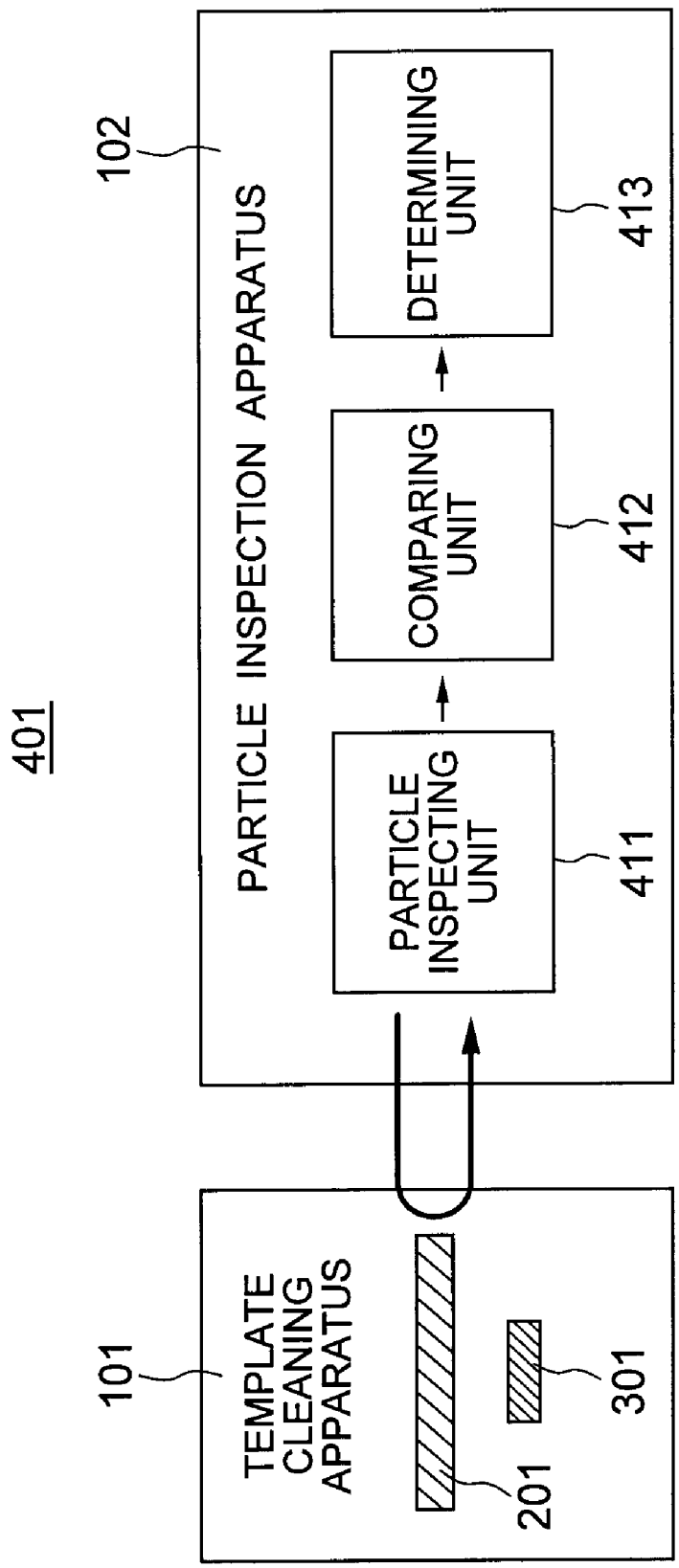
FIG. 17 is a block diagram showing a modification of the template cleaning system of FIG. 2.

FIG. 17 shows an example of a template cleaning system 401 in which the determining procedure of step S6 is automated. The template cleaning system 401 shown in FIG. 17 includes a template cleaning apparatus 101 and a particle inspection apparatus 102. The particle inspection apparatus 102 includes a particle inspecting unit 411 that carries out the particles measuring procedure of step S5, a comparing unit 412 that compares the value obtained through the particle measurement with a reference value, and a determining unit 413 that carries out the determining procedure of step S6 based on the result of the comparison. An example of the value obtained through the particle measurement may be the number of defects detected at step S5, or the value obtained by dividing the number of defects detected at step S5 by the number of defects detected at step S1. The comparing unit 412 and the determining unit 413 can be realized by a processor in the particle inspection apparatus 102 executing a program recorded in a storage device such as a HDD or a ROM. In such a case, the filter change may also be automatically performed by the particle inspection apparatus 102.

As described above, in this embodiment, the chamber 111 is designed to accommodate the wafer 201 and the template 301. Accordingly, in this embodiment, the template 301 can be cleaned after minute-size particles is removed through the particle inspection performed on the wafer 201 by the particle inspection apparatus 102.

In this embodiment, the stage 131 is designed so that the wafer 201 and the template 301 can be placed thereon. Also, in this embodiment, the transfer arm 123 is designed to transfer the wafer 201 and the template 301. Accordingly, in this embodiment, the wafer 201 and the template 301 can be placed and transferred in the same chamber 111.

Next, a second embodiment of the present invention is described. The second embodiment is a modification of the first embodiment, and the aspects of the second embodiment that differ from the first embodiment are mainly described below.

Second Embodiment

Figure 18:
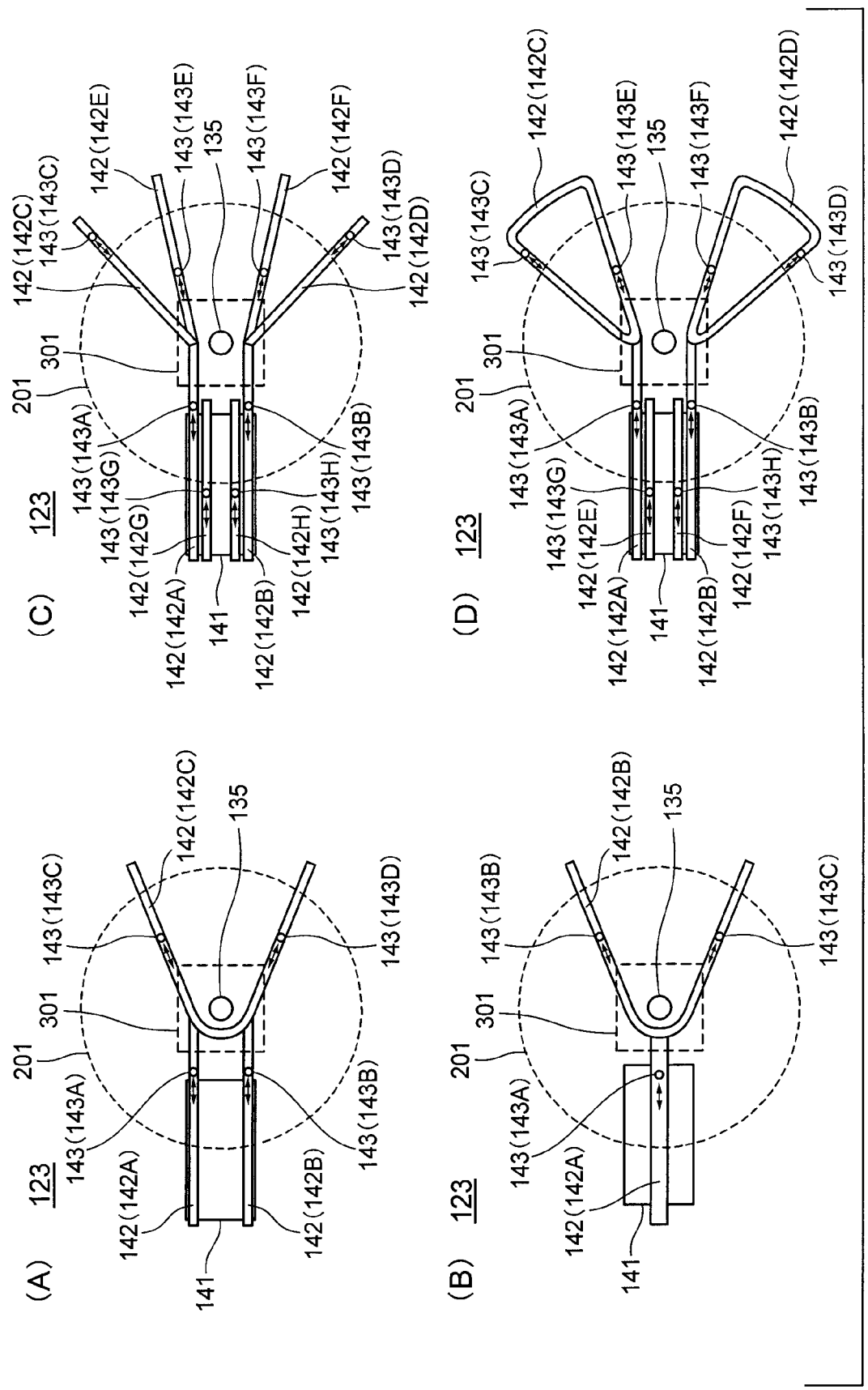
FIG. 18 shows top views showing example structures of a transfer arm in accordance with a second embodiment.

FIG. 18 shows top views showing example structures of the transfer arm 123 in accordance with a second embodiment. Like the template cleaning apparatus 101 of the first embodiment, the template cleaning apparatus 101 of the second embodiment has the structure illustrated in FIG. 1. However, the transfer arm 123 of the second embodiment has one of the structures illustrated in FIG. 18, while the transfer arm 123 of the first embodiment has the structure illustrated in FIG. 6.

The transfer arm 123 shown in FIG. 18(A) includes an arm body 141, three supporting members 142A to 142C, and four chuck pins 143A to 143D. The supporting member 142C shown in FIG. 18(A) is like a structure that is formed by turning the two supporting members 142C and 142D of FIG. 6 into one. The supporting member 142C shown in FIG. 18(A) has a U-like shape. Two chuck pins 143C and 143D are provided on the supporting member 142C shown in FIG. 18(A).

The transfer arm 123 shown in FIG. 18(B) includes an arm body 141, two supporting members 142A and 142B, and three chuck pins 143A to 143C. The supporting member 142A shown in FIG. 18(B) is like a structure that is formed by turning the two supporting members 142A and 142B of FIG. 18(A) into one. The supporting member 142A shown in FIG. 18(B) has a stick-like shape. One chuck pin 143A is provided on the supporting member 142A shown in FIG. 18(B).

In each of the example cases shown in FIGS. 18(A) and 18(B), the push-up board 135 is inserted in the bent portion of the U-shaped supporting member. Each of the structures shown in FIGS. 18(A) and 18(B) is effective in a case where the strength of the supporting members is to be increased, by connecting or combining the two supporting members into one.

The transfer arm 123 shown in FIG. 18(C) includes an arm body 141, eight supporting members 142A to 142H, and eight chuck pins 143A to 143H. The supporting members 142C and 142E of FIG. 18(C) have a structure wherein the supporting member 142C of FIG. 6 is replaced with two supporting members. The supporting members 142C and 142E of FIG. 18(C) are attached to the top end of the supporting member 142A in a V-like fashion. Likewise, the supporting members 142D and 142F of FIG. 18(C) are like a structure that is formed by replacing the supporting member 142D of FIG. 6 with two supporting members. The supporting members 142D and 142F of FIG. 18(C) are attached to the top end of the supporting member 142B in a V-like fashion. The supporting members 142G and 142H of FIG. 18(C) are attached to the arm body 141 in a parallel fashion, like the supporting members 142A and 142B. The chuck pins 143C to 143H are provided on the supporting members 142C to 142H of FIG. 18(C), respectively.

The transfer arm 123 shown in FIG. 18(D) includes an arm body 141, six supporting members 142A to 142F, and eight chuck pins 143A to 143H. The supporting member 142C of FIG. 18(D) is like a structure that is formed by connecting the top ends of the two supporting members 142C and 142E of FIG. 18(C). The supporting member 142C of FIG. 18(D) is triangular in shape. Two chuck pins 143C and 143E are provided on the supporting member 142C of FIG. 18(D). Likewise, the supporting member 142D of FIG. 18(D) is like a structure that is formed by connecting the top ends of the two supporting members 142D and 142F of FIG. 18(C). The supporting member 142D of FIG. 18(D) is triangular in shape. Two chuck pins 143D and 143F are provided on the supporting member 142D of FIG. 18(D). The supporting members 142E and 142F of FIG. 18(D) are attached to the arm body 141 in a parallel fashion, like the supporting members 142A and 142B. The chuck pins 143G and 143H are provided on the supporting members 142E and 142F of FIG. 18(D), respectively.

In the example case shown in FIGS. 18(C) and 18(D), the chuck pins 143C, 143D, 143G, and 143H are used only for holding the wafer 201, and the chuck pins 143A, 143B, 143E, and 143F are used only for holding the template 301. Each of the structures illustrated in FIGS. 18(C) and 18(D) is effective in a case where the chuck pines for the wafer 201 are to be separated from the chuck pins for the template 301. In this case, the shape of each of the chuck pins for the wafer 201 may differ from the shape of each of the chuck pins for the template 301.

Like the transfer arm 123 of the first embodiment, each transfer arm 123 of this embodiment is designed to transfer the wafer 201 and the template 301. Accordingly, the wafer 201 and the template 301 can be transferred into the same chamber 111 in this embodiment. With this arrangement, the template 301 can be cleaned after minute-size particles are removed to the particle inspection performed on the wafer 201 by the particle inspection apparatus 102 in this embodiment.

The transfer arm 123 may have a structure different from any of the structures described in the first and second embodiments. For example, the transfer arm 123 may be formed with an arm body 141, at least one supporting member 142, and chuck pins 143.

As described above, the embodiments of the present invention can provide a template cleaning method, a cleaning system, and a cleaning apparatus that can clean a template for nanoimprint after minute-size particles are removed.

Although specific embodiments of the present invention have been described as the first and second embodiments, the present invention is not limited to those embodiments.

The invention claimed is:

1. A template cleaning system for cleaning a template for nanoimprint, the system comprising:
    a chamber for containing a wafer and the template;
    a stage on which the wafer and the template are capable of being placed,
    the stage being provided in the chamber, and having a stage surface on which the wafer is to be placed, and
    the stage surface being provided with a hole in which the template is to be placed;
    a transfer arm which is capable of transferring the wafer and the template into the chamber; and
    a particle inspection apparatus for inspecting the wafer for particles.

2. The system according to claim 1,
    wherein a plane shape of the hole is substantially the same as a plane shape of the template, and
    a depth of the hole is substantially the same as a thickness of the template.

3. The system according to claim 1, further comprising:
    a movable shaft which penetrates the hole;
    a push-up member provided at an upper end of the movable shaft, and to be used to support the wafer and the template; and
    a motor which vertically moves the wafer and the template supported by the push-up member, by moving the movable shaft in a vertical direction.

4. The system according to claim 3, wherein the transfer arm comprises:
    an arm body;
    at least one supporting member attached directly or indirectly to the arm body, and to be used to support the wafer and the template; and
    a plurality of chuck pins provided on the supporting member, and to be used to hold the wafer and the template supported by the supporting member.

5. The system according to claim 4, wherein
    the at least one supporting member includes first and second supporting members between which a gap is provided, and the wafer and the template are transferred from the transfer arm to the push-up member by inserting the push-up member in the gap.

6. The system according to claim 4, wherein
the at least one supporting member includes a supporting member having a U-shape, and
the wafer and the template are transferred from the transfer arm to the push-up member by inserting the push-up member in a bent portion of the supporting member having the U-shape.

7. The system according to claim 4, wherein
the chuck pins include chuck pins for the wafer and chuck pins for the template.

8. A template cleaning system for cleaning a template for nanoimprint, the system comprising:
a chamber for containing a wafer and the template;
a spin chuck including a stage on which the wafer and the template are capable of being placed, the stage being provided in the chamber, and the spin chuck rotating the wafer and the template placed on the stage around the same rotation axis;
a transfer arm which is capable of transferring the wafer and the template into the chamber; and
a particle inspection apparatus for inspecting the wafer for particles.

9. The system according to claim 8, further comprising:
a first nozzle for supplying chemical solutions onto surfaces of the wafer and the template placed on the stage,
wherein the wafer and the template are cleaned by rotating the wafer and the template by the spin chuck, and supplying the chemical solutions onto the surfaces of the wafer and the template by the first nozzle.

10. The system according to claim 9, further comprising:
a second nozzle for supplying pure water onto the surfaces of the wafer and the template placed on the stage,
wherein the chemical solutions on the wafer and the template are removed by rotating the wafer and the template by the spin chuck, and supplying pure water onto the surfaces of the wafer and the template by the second nozzle.

11. A template cleaning apparatus for cleaning a template for nanoimprint, the apparatus comprising:
a chamber for containing a wafer and the template;
a stage on which the wafer and the template are capable of being placed, the stage being provided in the chamber, and having a stage surface on which the wafer is to be placed, and the stage surface being provided with a hole in which the template is to be placed; and
a transfer arm which is capable of transferring the wafer and the template into the chamber.

12. The apparatus according to claim 11, wherein
a plane shape of the hole is substantially the same as a plane shape of the template, and
a depth of the hole is substantially the same as a thickness of the template.

13. The apparatus according to claim 11, further comprising:
a movable shaft which penetrates the hole;
a push-up member provided at an upper end of the movable shaft, and to be used to support the wafer and the template; and
a motor which vertically moves the wafer and the template supported by the push-up member, by moving the movable shaft in a vertical direction.

14. The apparatus according to claim 13, wherein
the transfer arm comprises:
an arm body;
at least one supporting member attached directly or indirectly to the arm body, and to be used to support the wafer and the template; and
a plurality of chuck pins provided on the supporting member, and to be used to hold the wafer and the template supported by the supporting member.

15. The apparatus according to claim 14, wherein
the at least one supporting member includes first and second supporting members between which a gap is provided, and
the wafer and the template are transferred from the transfer arm to the push-up member by inserting the push-up member in the gap.

16. The apparatus according to claim 14, wherein
the at least one supporting member includes a supporting member having a U-shape, and
the wafer and the template are transferred from the transfer arm to the push-up member by inserting the push-up member in a bent portion of the supporting member having the U-shape.

17. The apparatus according to claim 14, wherein
the chuck pins include chuck pins for the wafer and chuck pins for the template.

18. A template cleaning apparatus for cleaning a template for nanoimprint, the apparatus comprising:
a chamber for containing a wafer and the template;
a spin chuck including a stage on which the wafer and the template are capable of being placed, the stage being provided in the chamber, and the spin chuck rotating the wafer and the template placed on the stage around the same rotation axis; and
a transfer arm which is capable of transferring the wafer and the template into the chamber.

19. The apparatus according to claim 18, further comprising:
a first nozzle for supplying chemical solutions onto surfaces of the wafer and the template placed on the stage,
wherein the wafer and the template are cleaned by rotating the wafer and the template by the spin chuck, and supplying the chemical solutions onto the surfaces of the wafer and the template by the first nozzle.

20. The apparatus according to claim 19, further comprising:
a second nozzle for supplying pure water onto the surfaces of the wafer and the template placed on the stage,
wherein the chemical solutions on the wafer and the template are removed by rotating the wafer and the template by the spin chuck, and supplying pure water onto the surfaces of the wafer and the template by the second nozzle.

* * * * *